United States Patent [19]
Tsuji et al.

[11] Patent Number: 5,699,027
[45] Date of Patent: Dec. 16, 1997

[54] SURFACE ACOUSTIC WAVE DEVICES HAVING A GUARD LAYER

[75] Inventors: Yasunobu Tsuji, Uji; Kazuo Eda, Nara; Yutaka Taguchi, Takatsuki; Katsuyuki Miyauchi; Keiji Onishi, both of Settsu, all of Japan

[73] Assignee: Matsushita Electric Industrial Co., Ltd., Osaka, Japan

[21] Appl. No.: 623,392

[22] Filed: Mar. 27, 1996

[30] Foreign Application Priority Data

Mar. 28, 1995 [JP] Japan ................................. 7-069826

[51] Int. Cl.⁶ ........................................... H03H 9/00
[52] U.S. Cl. ................ 333/193; 310/313 R; 310/344; 310/348
[58] Field of Search ........................ 333/193–196; 310/313 R, 313 B, 313 C, 313 D, 344, 348

[56] References Cited

U.S. PATENT DOCUMENTS

| | | | |
|---|---|---|---|
| 4,736,128 | 4/1988 | Takoshima et al. | 310/348 |
| 4,737,742 | 4/1988 | Takoshima et al. | 310/348 |
| 4,779,246 | 10/1988 | Dietasch et al. | 310/348 |
| 4,795,934 | 1/1989 | Rogerson et al. | 310/344 |
| 5,208,504 | 5/1993 | Parker et al. | 310/344 |
| 5,252,882 | 10/1993 | Yatsuda | 310/348 |
| 5,459,368 | 10/1995 | Onishi et al. | 310/344 |
| 5,471,722 | 12/1995 | Yatsuda | 310/344 |
| 5,523,641 | 6/1996 | Yatsuda et al. | 310/348 |

FOREIGN PATENT DOCUMENTS 0 637 871  2/1995  European Pat. Off. .

OTHER PUBLICATIONS

Patent Abstracts Of Japan, vol. 16, No. 255 (E–1214)(Jun. 10, 1992).

*Primary Examiner*—Benny Lee
*Assistant Examiner*—Darius Gambino
*Attorney, Agent, or Firm*—McDermott, Will & Emery

[57] ABSTRACT

A surface acoustic wave device including a dielectric substrate having an input electrode and an output electrode and a grounding electrode on a first surface of the dielectric substrate, and an outer electrode on a second surface of the dielectric substrate; and a surface acoustic wave element having an electrode pad and a comb-shaped electrode disposed on a first surface of the surface acoustic wave element. The surface acoustic wave element is bonded to the dielectric substrate via a metal bump and a conductive resin formed on the electrode pad. The surface acoustic wave device further includes an insulating resin deposited on the periphery of the metal bump, and a guard layer shorter in height than the surface acoustic wave element formed adjacent the surface acoustic wave element on the first surface of the dielectric substrate.

15 Claims, 9 Drawing Sheets

SURFACE ACOUSTIC WAVE DEVICES HAVING A GUARD LAYER

BACKGROUND OF THE INVENTION

I. Field of the Invention

The present invention relates to a surface acoustic wave device, and more particularly to a packing structure of surface acoustic wave device for mounting surface acoustic wave elements by a flip-chip bonding method.

II. Description of the Prior Art

Along with the advancement of mobile communication technology, there is an increasing demand for smaller components exhibiting improved electric characteristics, such as surface acoustic wave devices used as interstage filters and antenna filters for transmission and reception in various mobile communication apparatuses.

One known method for reducing the size of surface acoustic wave devices is the face-down mounting method. In the face-down mounting method (also known as flip-chip bonding), the functional surface of the elements and the circuit board are set face to face, and are connected together electrically and mechanically via conductive bumps or the like. As such, bonding wire is not necessary in the face-down method, which is a major advantage.

However, because surface acoustic waves propagate on the functional surface of the surface acoustic wave element, surface acoustic wave elements require a space for propagation of surface acoustic waves near the functional surface. Furthermore, the piezoelectric substrate used in surface acoustic wave elements is generally high in pyroelectricity, and therefore when the operating frequency becomes high, the line width of the comb-shaped electrode of the surface acoustic element becomes rather small on the order of about 0.5 µm to about 1 µm, and as a result, the comb-shaped electrode can be broken due to temperature changes in the process such as forming of conductive bumps and pyroelectricity of the piezoelectric substrate. It was therefore necessary to consider the intrinsic problem of surface acoustic wave elements.

Figure 8A:
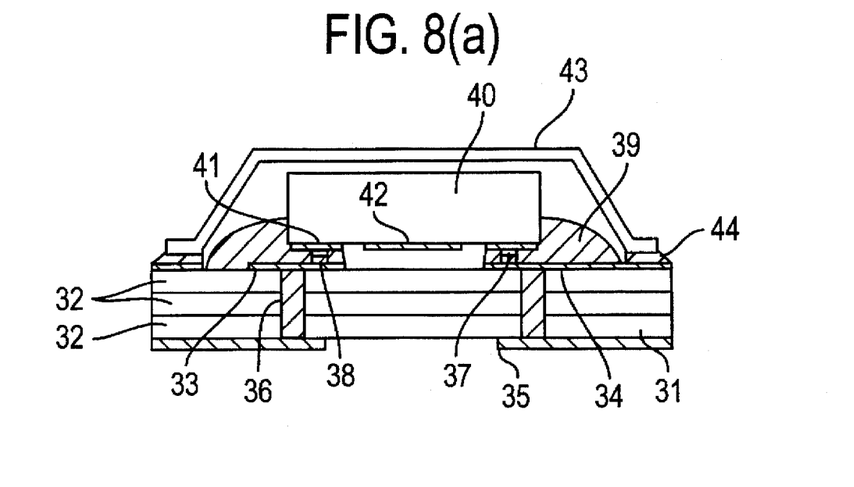
FIG. 8(a) is a sectional view of a prior art surface acoustic wave device and FIG. 8(b) is a top view of the device of FIG. 8(a).
Figure 8B:
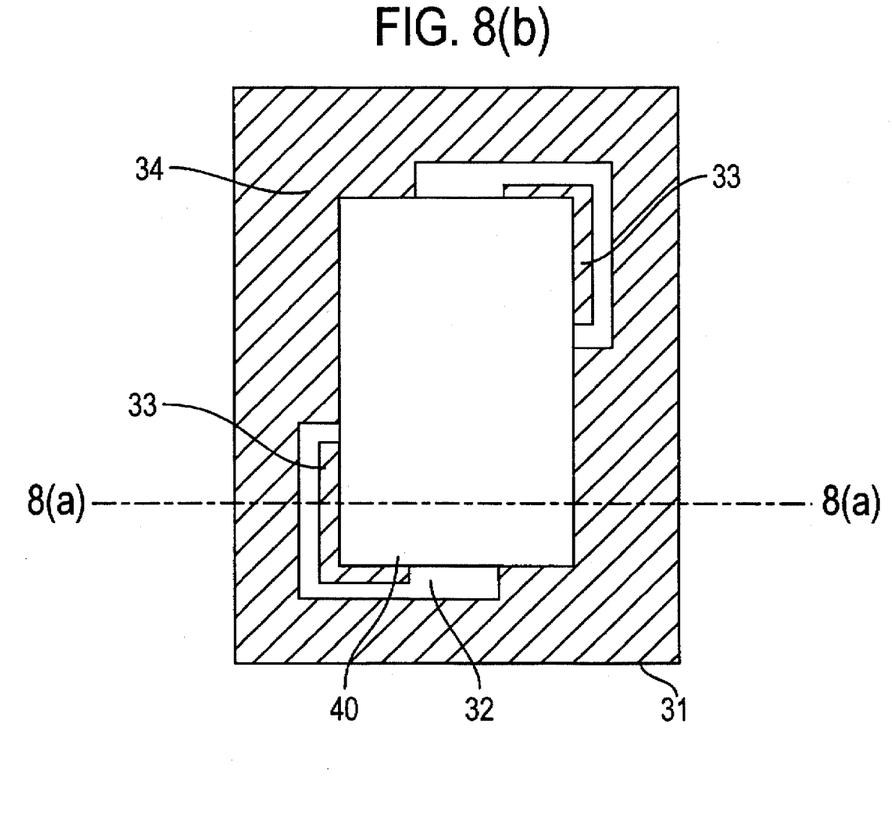

FIG. 8(a) is a sectional view of a known surface acoustic wave device. FIG. 8(b) is a top view of the device illustrated in FIG. 8(a).

In the diagram, reference numeral 31 is a multi-layer substrate, 32 is a dielectric layer, 33 illustrates input and output electrodes, 34 is a grounding electrode, 35 is an outer electrode, 36 is a via hole, 37 is a metal bump, 38 is a conductive resin, 39 is an insulating resin, 40 is a surface acoustic wave element, 41 is an electrode pad, 42 is a comb-shaped electrode, 43 is a metal cap, and 44 is solder.

The surface acoustic wave element 40 illustrated in FIG. 8(a) comprises the electrode pad 41 and comb-shaped electrode 42. The metal bump 37 made of gold or aluminum is formed on the electrode pad 41. The conductive resin 38 is applied on the tip of the metal bump 37. Next, the surface acoustic wave element 40, and the multi-layer substrate 31 comprising the input and output electrodes 33 and grounding electrode 34 on the principal surface side of the dielectric layer 32, are set face to face. The surface acoustic wave element 40 is then affixed to the substrate 31 by heating and curing the conductive resin 38. The surface acoustic wave element 40 is electrically and mechanically secured to the substrate 31 via the metal bump 37 and the conductive resin 38. Furthermore, around the surface acoustic wave element 40, the insulating resin 39 adjusted to a high viscosity is injected, heated and cured such that the adhesive strength of the surface acoustic wave element 40 and the multi-layer substrate 31 is reinforced. The input and output electrodes 33 and grounding electrode 34 are electrically connected with the outer electrode 35 through the via hole 36. The metal cap 43 is adhered to the grounding electrode 34 with solder 44 so as to form an airtight seal. According to foregoing method, it is possible to maintain a space around the comb-shaped electrode 42 of the surface acoustic wave element 40, and as a result, problems such as the breaking of the comb-shaped electrode during mounting were solved.

However, in the foregoing method of mounting the element 40, because the multi-layer substrate 31 is flat, the insulating resin 39 is widely dispersed. As a result, in order to generate an airtight seal with the metal cap 43, it is necessary to widen the interval between the metal cap 43 and surface acoustic wave element 40. Thus, the overall size of the device cannot be minimized.

Figure 9A:
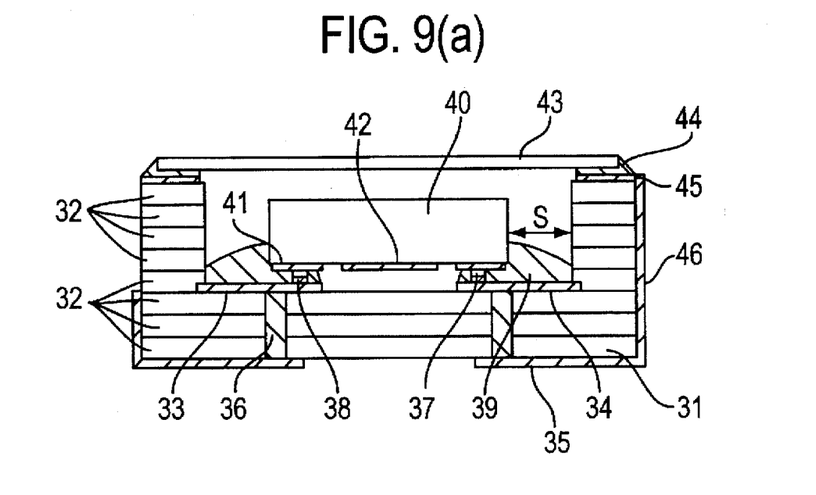
FIG. 9(a) is a sectional view of a prior art surface acoustic wave device and FIG. 9(b) is a top view of the device of FIG. 9(a).
Figure 9B:
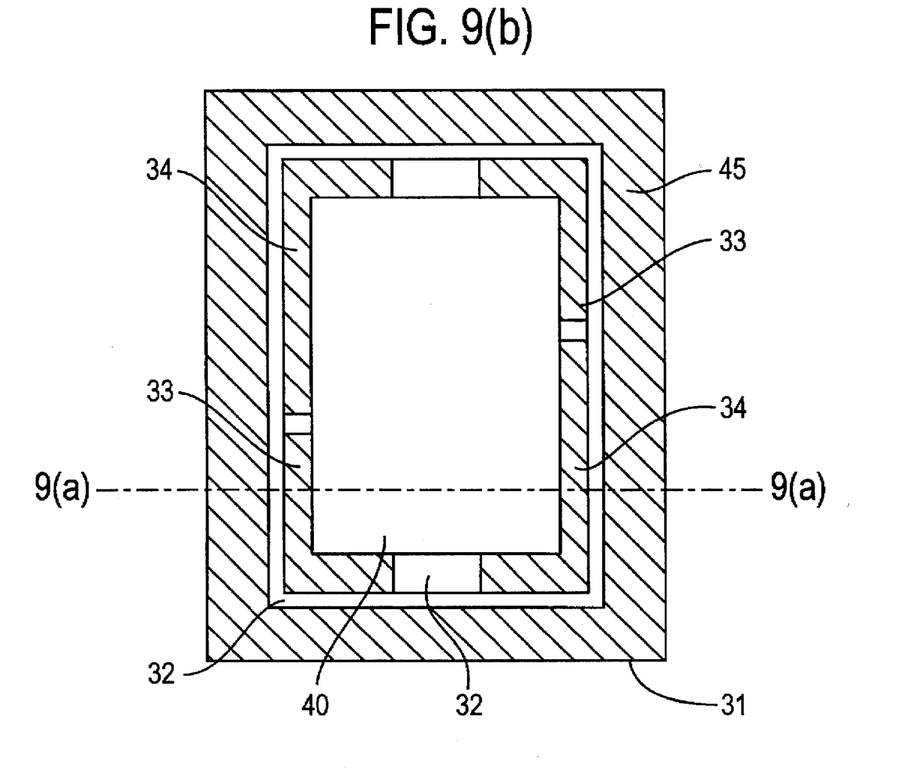

FIG. 9(a) illustrates a sectional view of another known surface acoustic wave device, which attempts to solve the foregoing problem. FIG. 9(b) illustrates a top view of the device of FIG. 9(a).

As shown in FIG. 9(a), reference numeral 45 denotes a grounding electrode, 46 is an outer terminal and all other reference numerals correspond to the same elements as in FIG. 8(a) and (b).

In the surface acoustic wave device of FIG. 9(a), the grounding electrode 45 is electrically connected to the outer electrode 35 through the outer terminal 46, and the multi-layer substrate 31 is changed from having a flat surface to one have a recessed surface exhibiting a depth which is greater than the height of the surface acoustic wave element 40. All other elements are the same as in FIG. 8.

As a result of the multi-layer substrate 31 having a recess, the spreading of the insulating resin 39 can be prevented. However, as a space must be maintained around the comb-shaped electrode 42 of the surface acoustic wave element 40, the viscosity of the insulating resin 39 must be increased. As such, when the gap S between the surface acoustic wave element 40 and the multi-layer substrate 31 is narrow, because the multi-layer substrate 31 has a recess which is taller than the surface acoustic wave element 40, it is hard to inject the insulating resin 39, and therefore the insulating resin 39 does not permeate up to the periphery of the metal bump 37. As a result, the adhesive bond between the surface acoustic element 40 and the substrate 31 cannot be reinforced. In order to deposit the insulating resin 39 near the periphery of the metal bump 37, it is necessary to widen the gap S between the surface acoustic wave element 40 and the multi-layer substrate 31. Accordingly, the overall size of the device cannot be minimized.

SUMMARY OF THE INVENTION

Accordingly, an object of the present invention is to provide a surface acoustic wave device exhibiting a reduction in overall size as compared to known devices, and which prevents the insulating resin from spreading.

To achieve the foregoing object, the surface acoustic wave device of the present invention comprises a dielectric substrate having an input electrode and an output electrode and a grounding electrode on a first surface of the dielectric substrate, and an outer electrode on a second surface of the dielectric substrate; and a surface acoustic wave element having an electrode pad and a comb-shaped electrode disposed on a first surface of the surface acoustic wave element. The surface acoustic wave element is bonded to the dielectric substrate via a metal bump and a conductive resin formed on the electrode pad. The surface acoustic wave device further comprises an insulating resin deposited on the periphery of the metal bump, and a guard layer shorter in height than the surface acoustic wave element formed adjacent the surface acoustic wave element on the first surface of the dielectric substrate.

As a result of the present invention, undesirable spreading of the insulating resin is prevented by the guard layer. However, because the guard layer is shorter in height than the surface acoustic wave element, it is easier to inject the insulating resin, and therefore if the gap of the surface acoustic wave element and the multi-layer substrate is narrow, the insulating resin permeates closely to the metal bump, so that the surface acoustic wave element may be reduced in size.

Additional advantages of the present invention will become apparent to those skilled in the art from the following detailed description of exemplary embodiments, which exemplify the best mode of carrying out the invention.

The invention itself, together with further objects and advantages, can be better understood by reference to the following detailed description and the accompanying drawings.

DETAILED DESCRIPTION OF THE INVENTION (Embodiment 1)

Figure 1A:
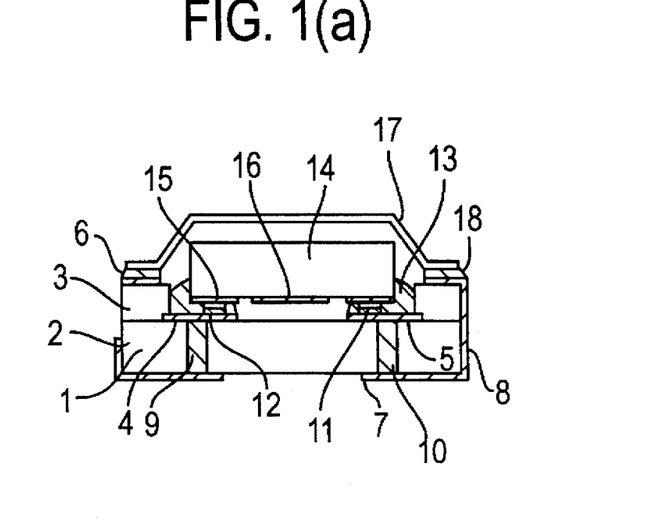
FIG. 1(a) is a sectional view of a surface acoustic wave device of a first embodiment of the invention.
Figure 1B:
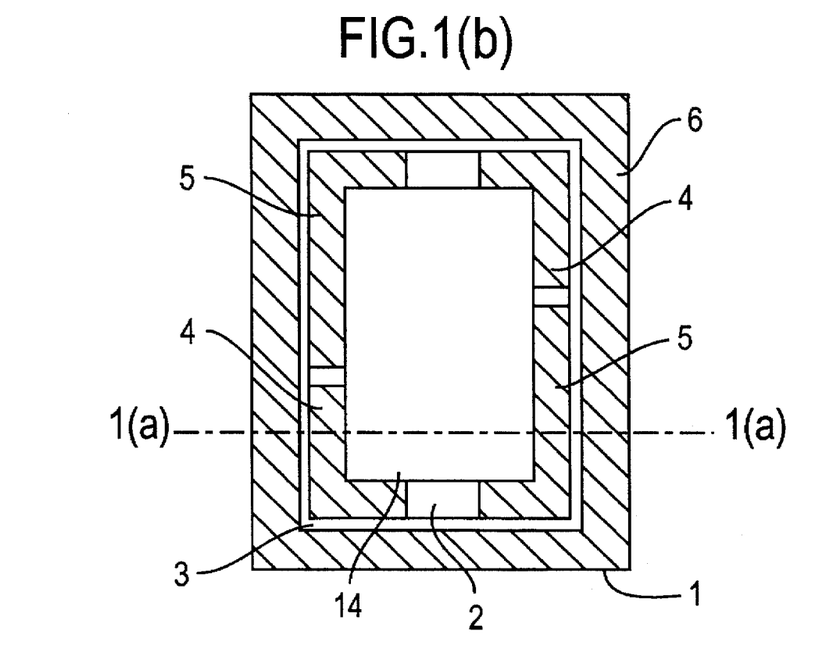
FIG. 1(b) is a top view of the device of FIG. 1(a).

Referring now to the drawings, the first embodiment of the invention is described in detail below. FIG. 1(a) is a sectional view of a surface acoustic wave device in accordance with a first embodiment of the invention, and FIG. 1(b) is a top view of the device of FIG. 1(a).

Referring to FIG. 1(a), reference numeral 1 is a multi-layer substrate, 2, 3 are dielectric layers, 4 shows input and output electrodes, 5, 6 are grounding electrodes, 7 is an outer electrode, 8 is an outer terminal, 9, 10 are via holes, 11 is a metal bump, 12 is a conductive resin, 13 is an insulating resin, 14 is a surface acoustic wave element, 15 is an electrode pad, 16 is a comb-shaped electrode, 17 is a metal cap, and 18 is solder.

In the embodiment of FIG. 1(a), the multi-layer substrate 1 comprises dielectric layers 2, 3 made of a low temperature baking material that can be baked below approximately 1000° C. On the principal surface side of the dielectric layer 2 in a green sheet form having via holes 9, 10, the input and output electrodes 4 and grounding electrode 5 are formed by electrode paste. The grounding electrode 6 is also formed by electrode paste on the principal surface side of the dielectric layer 3 of the green sheet form for forming a recess. The dielectric layer 3 and dielectric layer 2 are laminated sequentially, and then baked at 900° C. Thereafter, the outer electrode 7 is formed by electrode paste, and then the outer terminal 8 is formed by electrode paste and baked. Then, nickel/gold plating is applied. As a result, the outer electrode 7 is electrically connected to the input and output electrodes 4 through the via hole 9, to the grounding electrode 5 through the via hole 10, and to the grounding electrode 6 through the outer terminal 8. In this embodiment, an electrode paste comprising an Ag derivative is used as the electrode paste for the input and output electrodes 4, grounding electrodes 5, 6, outer electrode 7, and outer terminal 8. Of course other suitable materials can be utilized.

The surface acoustic wave element 14 in the embodiment of FIG. 1(a) is made of 36° Y-X lithium tantalate, and comprises electrode pad 15 and comb-shaped electrode 16 formed on one principal surface side of the piezoelectric substrate so as to form a surface acoustic wave filter. The electrode pad 15 and comb-shaped electrode 16 are formed by conventional photolithographic techniques, and comprise mainly metal, such as aluminum. A metal bump 11 is formed on the electrode pad 15 of the surface acoustic wave element 14 using, for example, a gold wire. The formed metal bump is adjusted to a uniform height, and then the conductive resin 12 is transferred to the front end of the metal bump 11. The conductive resin 12 can comprise, but is not limited to, a thermoplastic conductive resin containing Ag—Pd alloy particles.

Next, the input and output electrodes 4 and grounding electrode 5 of the multi-layer substrate 1, and the metal bumps 11 formed on the surface acoustic wave element 14 are positioned so as to face one another, and then the conductive resin 12 is cured so as to connect the substrate 1 to the element 14 both electrically and mechanically. Moreover, a thermosetting insulating resin 13 adjusted to a high viscosity is injected around the surface acoustic wave element 14 between the surface acoustic wave element 14 and multi-layer substrate 1, so that a space is maintained around the comb-shaped electrode 16. Upon curing the thermosetting insulating resin 13, the adhesion strength of the surface acoustic wave element 14 and multi-layer substrate i is reinforced. Finally, by adhering the metal cap 17 with the grounding electrode 6 and solder 18, an airtight seal is obtained.

Based on the foregoing construction, the surface acoustic wave device of the first embodiment comprises a guard layer formed by the dielectric layer 3, which prevents the spreading of the insulating resin 13. Moreover, since the height of the guard layer is lower than the height of the surface acoustic wave element 14, even if the gap between the surface acoustic wave element 14 and the guard layer is narrow, the insulating resin 13 of high viscosity can still be easily injected into the area adjacent the metal bumps 11. Accordingly, the adhesion strength of the surface acoustic wave element 14 and multi-layer substrate 1 can be reinforced, while simultaneously providing a reduction in the size of the surface acoustic wave device so as to obtain an ultra-small surface acoustic wave device having approximate overall dimensions of 2.5 mm×2.8 mm×1.5 mm.

It is noted that each one of the dielectric layers 2, 3 forming the multi-layer substrate 1 can also be formed by a plurality of layers.

(Embodiment 2)

Figure 2:
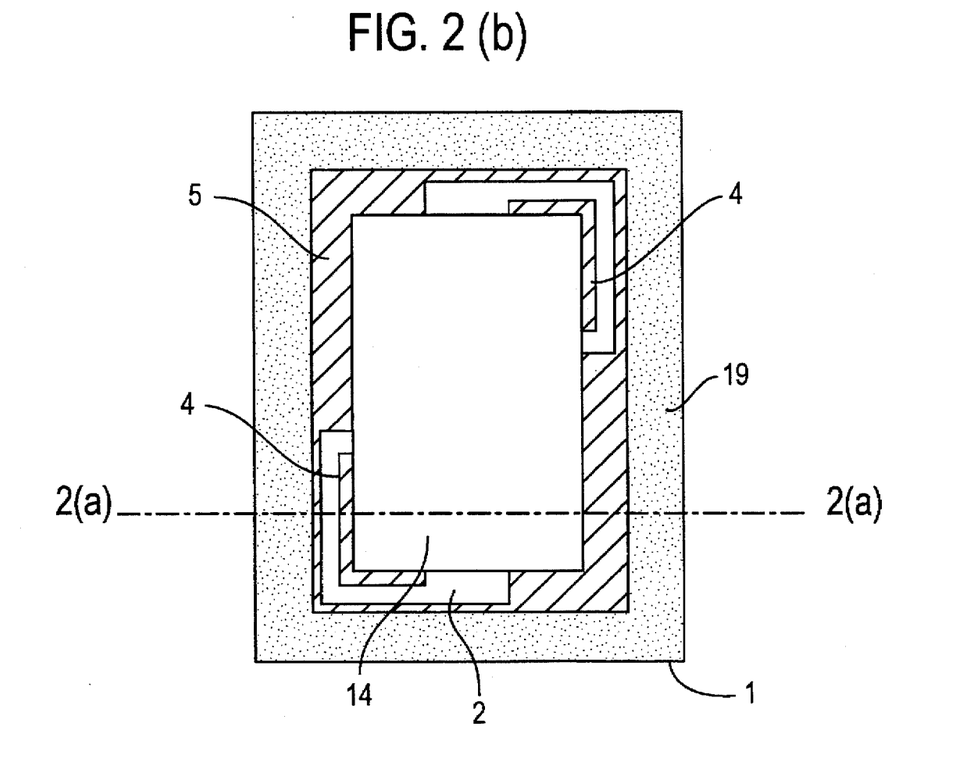
FIG. 2(a) is a sectional view of a surface acoustic wave device of a second embodiment of the invention.
FIG. 2(b) is a top view of the device of FIG. 2(a).
Figure 2A:
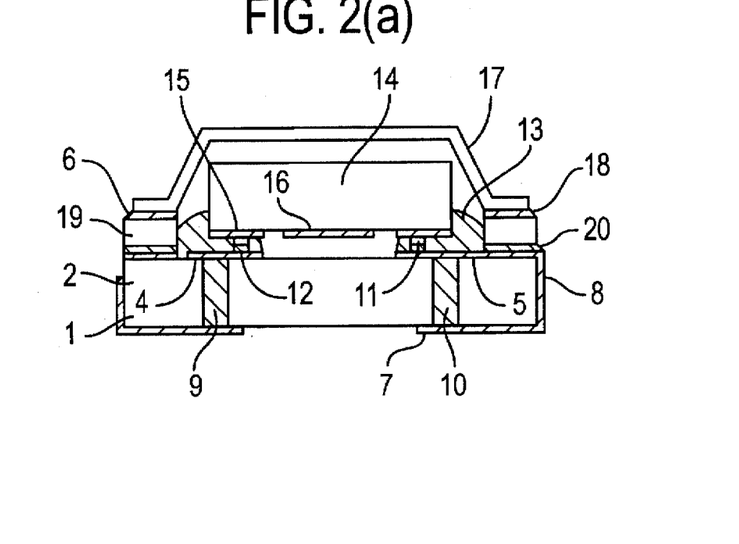

FIG. 2(a) is a sectional view of a second embodiment of the surface acoustic wave device of the present invention. FIG. 2(b) is a top view of the device of FIG. 2(a).

Referring to FIG. 2(a), reference numeral 19 denotes a metal ring, 20 is high temperature solder, and all other numerals represent the same elements as described above in FIGS. 1(a) and (b).

According to the second embodiment, the multi-layer substrate 1 is made of a dielectric layer 2, and input and output electrodes 4 and grounding electrode 5 are formed by electrode paste on the principal surface side of the dielectric layer 2 in a green sheet form having via holes 9 and 10. Thereafter, by baking at 900° C., the outer electrode 7 and outer terminal 8 are formed in the method shown in the first embodiment. Next, the metal ring 19 is adhered to the grounding electrode 5 by the high temperature solder 20, thereby forming a guard ring made of metal. By mounting the surface acoustic wave element 14 on multi-layer substrate 1, by the method shown in the first embodiment, an ultra-small surface acoustic wave device can be obtained in the same manner as the first embodiment.

The surface acoustic wave device of the second embodiment has the same action and effects as the surface acoustic wave device of the first embodiment.

It is noted that the high temperature solder 20 can only be high in working temperature than the solder 18 for adhering the metal cap 17 and grounding electrode 6, and, for example, an Au/Sn alloy may be used. Further, the dielectric layer 2 forming the multi-layer substrate 1 can also be formed in a plurality of layers.

(Embodiment 3)

Figure 3A:
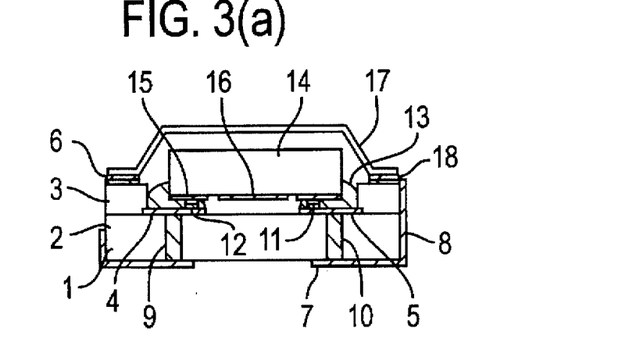
FIG. 3(a) is a sectional view of a surface acoustic wave device of a third embodiment of the invention.
Figure 3B:
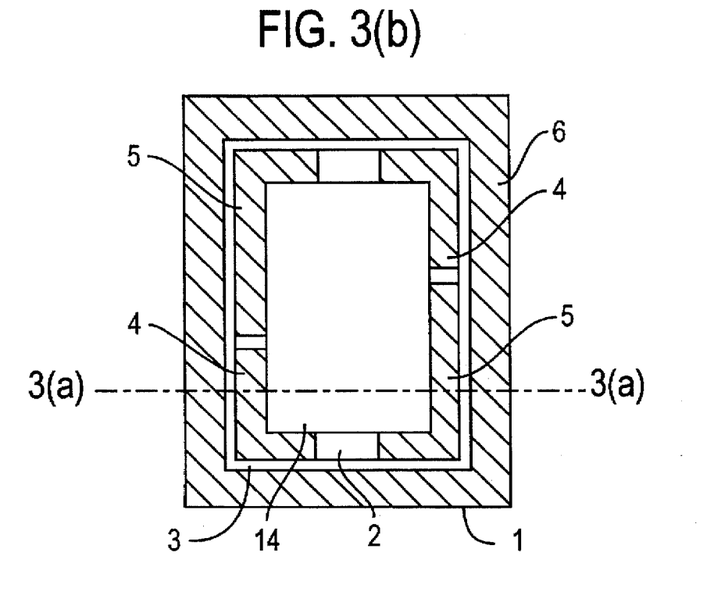
FIG. 3(b) is a top view of the device of FIG. 3(a)
Figure 3C:
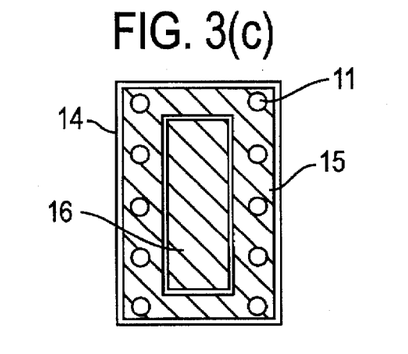
FIG. 3(c) is a top view of the functional surface of the surface acoustic wave element of the device.

FIG. 3(a) is a sectional view of a third embodiment of the surface acoustic wave device of the present invention. FIG. 3(b) is a top view of the device shown in FIG. 3(a). FIG. 3(c) is a top view of the functional surface of the surface acoustic wave element shown in FIG. 3(a).

In the diagram, elements which are identical to elements of FIG. 1(a) and (b) are identified by the same reference numerals.

According to the third embodiment, the metal bumps 11 formed on the electrode pad 15 of the surface acoustic wave element 14 are formed only on two confronting (i.e. opposing) sides as shown in FIG. 3(c). The insulating resin 13 is injected only on the two sides where the metal bumps 11 are formed. As a result, the adhesion strength of the surface acoustic wave element 14 and multi-layer substrate 1 is reinforced. The formation of the multi-layer substrate 1 and the mounting of the surface acoustic wave element 14 are the same as in the method shown in the first embodiment. As with the first two embodiments, the third embodiment results in an ultra-small surface acoustic wave device. It is noted that, the metal bumps 11 are formed on two confronting sides in the longitudinal direction of the surface acoustic wave element 14.

In the surface acoustic wave device of the third embodiment, because the metal bumps 11 are disposed only on two confronting sides of the surface acoustic wave element 14, the insulating resin 13 for reinforcing the adhesion strength of the surface acoustic wave element 14 and multi-layer substrate 1 is also only injected on the two sides on which the metal bumps 11 are disposed. Hence, it is not necessary to maintain a gap between the multi-layer substrate 1 and the surface acoustic wave element 14 on the two confronting sides on which the insulating resin 13 is not injected. As a result, a surface acoustic wave device having a smaller size than the surface acoustic wave device shown in the first embodiment can be obtained. Notwithstanding the further reduction in size, the same action and effects as in the surface acoustic wave device of the first embodiment are obtained by the surface acoustic wave device of the third embodiment.

If the insulating resin 13 is injected on only two sides, there is no effect on the frequency characteristics and/or reliability of the surface acoustic wave device. It is noted that the multi-layer substrate 1 of the third embodiment is the same as the multi-layer substrate shown in the first embodiment. However, the multi-layer substrate as shown in the second embodiment can also be used.

(Embodiment 4)

Figure 4A:
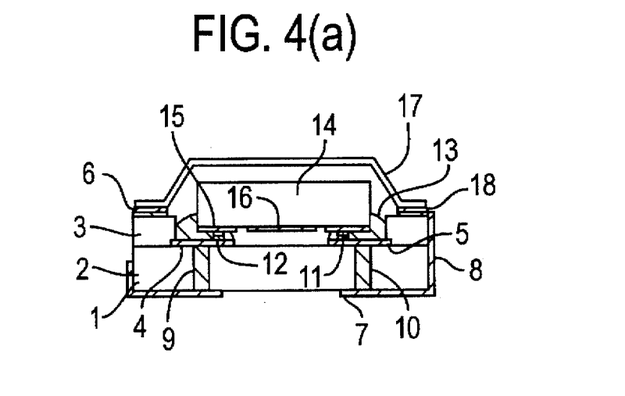
FIG. 4(a) is a sectional view of a surface acoustic wave device of a fourth embodiment of the invention.
Figure 4B:
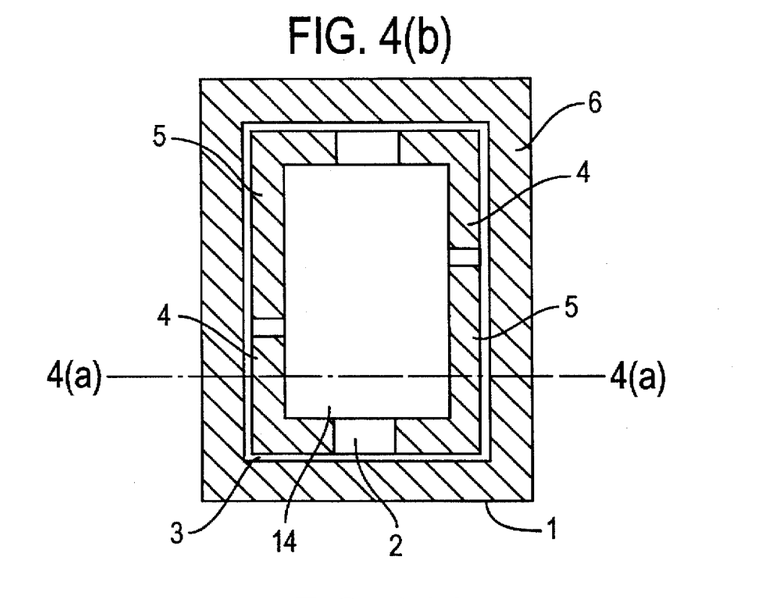
FIG. 4(b) is a top view of the device of FIG. 4(a)
Figure 4C:
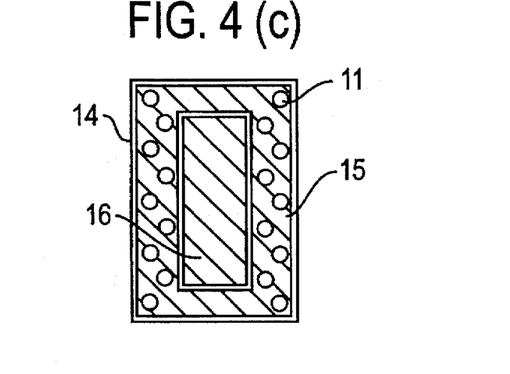
FIG. 4(c) is a top view of the functional surface of the surface acoustic wave element of the device.

FIG. 4(a) is a sectional view of a fourth embodiment of the surface acoustic wave device of the present invention, FIG. 4(b) is a top view of the device illustrated in FIG. 4(a), and FIG. 4(c) is a top view of the functional surface of the surface acoustic wave element illustrated in FIG. 4(a).

In the diagrams, elements which are identical to elements of FIG. 1(a) and (b) are identified by the same reference numerals.

According to the fourth embodiment, the metal bumps 11 formed on the electrode pad 15 of the surface acoustic wave element 14 are formed only on two confronting sides as shown in FIG. 4(c). Specifically, two rows of bumps 11 are formed alternately on each of the two confronting sides. The insulating resin 13 is injected only on the two sides where the metal bumps 11 are formed. As a result of the insulating resin 13, the adhesion strength of the surface acoustic wave element 14 and multi-layer substrate 1 is reinforced. The formation of the multi-layer substrate 1 and the mounting of the surface acoustic wave element 14 are the same as in the method shown in the first embodiment. Similar to the other embodiments, an ultra-small surface acoustic wave device can be obtained. In this embodiment, as in the third embodiment, the metal bumps 11 are formed on two confronting sides in the longitudinal direction of the surface acoustic wave element 14.

In the surface acoustic wave device of the fourth embodiment, because the metal bumps 11 are formed alternately in two rows on each side of the surface acoustic wave element 14, the insulating resin 13 hardly gets into the comb-shaped electrode 16 formed on the surface acoustic wave element 14, and therefore it is easier to maintain the space around the comb-shaped electrode 16. As a result, the degree of freedom of adjustment of viscosity of the insulating resin 13, having previously been necessarily adjusted to high viscosity, is increased, and therefore it is easier to adjust the viscosity. The same action and effects as in the surface acoustic wave device of the first and third embodiments are obtained by the fourth embodiment.

Furthermore, as in the third embodiment, if the insulating resin 13 is injected in only two sides, there is no effect on the frequency characteristic and/or reliability of the surface acoustic wave device. It is also noted that the multi-layer substrate 1 of the fourth embodiment is the same as the multi-layer substrate shown in the first embodiment. However, the multi-layer substrate as shown in the second embodiment can also be used.

(Embodiment 5)

Figure 5:
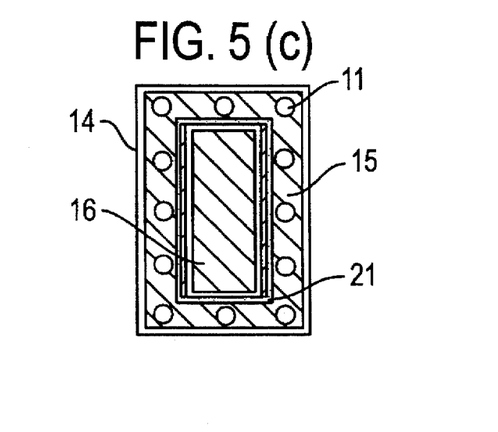
FIG. 5(a) is a sectional view of a surface acoustic wave device of a fifth embodiment of the invention.
FIG. 5(b) is a top view of the device of FIG. 5(a)
FIG. 5(c) is a top view of the functional surface of the surface acoustic wave element of the device.

FIG. 5(a) is a sectional view of a fifth embodiment of the surface acoustic wave device of the present invention. FIG. 5(b) is a top view of the device shown in FIG. 5(a), and FIG. 5(c) is a top view of the functional surface of the surface acoustic wave element shown in FIG. 5(a).

In FIG. 5(a), reference numeral 21 is a second guard layer made of sound absorbing material. The other elements which are identical to elements of FIG. 1(a) and (b) are identified by the same reference numerals.

According to the fifth embodiment, on the electrode pad 15 of the surface acoustic wave element 14, the sound absorbing material 21 is printed or applied, heated and cured, and then the metal bumps 11 are formed outside the second guard layer 21. The formation of the multi-layer substrate 1 and the mounting of the surface acoustic wave element 14 are the same as in the method shown in the first embodiment. As a result, an ultra-small surface acoustic wave device can be obtained.

In the surface acoustic wave device of the fifth embodiment, because the second guard layer 21 comprising sound absorbing material is provided between the comb-shaped electrode 16 of the surface acoustic wave element 14 and the metal bumps 11, the insulating resin 13 hardly gets into the comb-shaped electrode 16 formed on the surface acoustic wave element 14, and therefore it is easier to maintain the space around the comb-shaped electrode 16. Accordingly, the degree of freedom of adjustment of viscosity of the insulating resin 13, having previously been necessarily adjusted to high viscosity, is increased. As such, it is easier to adjust the viscosity. The same action an effects as in the surface acoustic wave device of the first embodiment are obtained by the fifth embodiment.

Furthermore, the second guard layer 21 comprising sound absorbing material is provided on the whole circumference of the surface acoustic wave element 14. However, if applied in the third and fourth embodiments, the second guard layer 21 comprising sound absorbing material can be disposed only on the two sides on which the metal bumps 11 are disposed, so that the action and effects are same as in the fourth embodiment. It is noted that the multi-layer substrate 1 of the fourth embodiment is the same as the multi-layer substrate of the first embodiment. However, the multi-layer substrate as shown in the second embodiment can also be used.

(Embodiment 6)

Figure 6A:
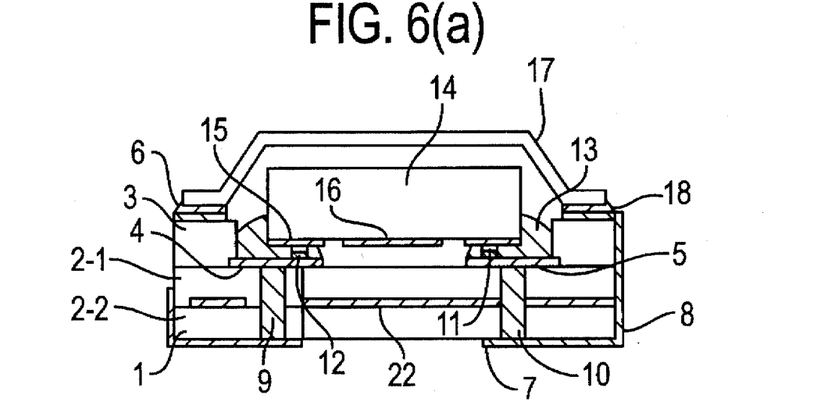
FIG. 6(a) is a sectional view of a surface acoustic wave device of a sixth embodiment of the invention.
Figure 6B:
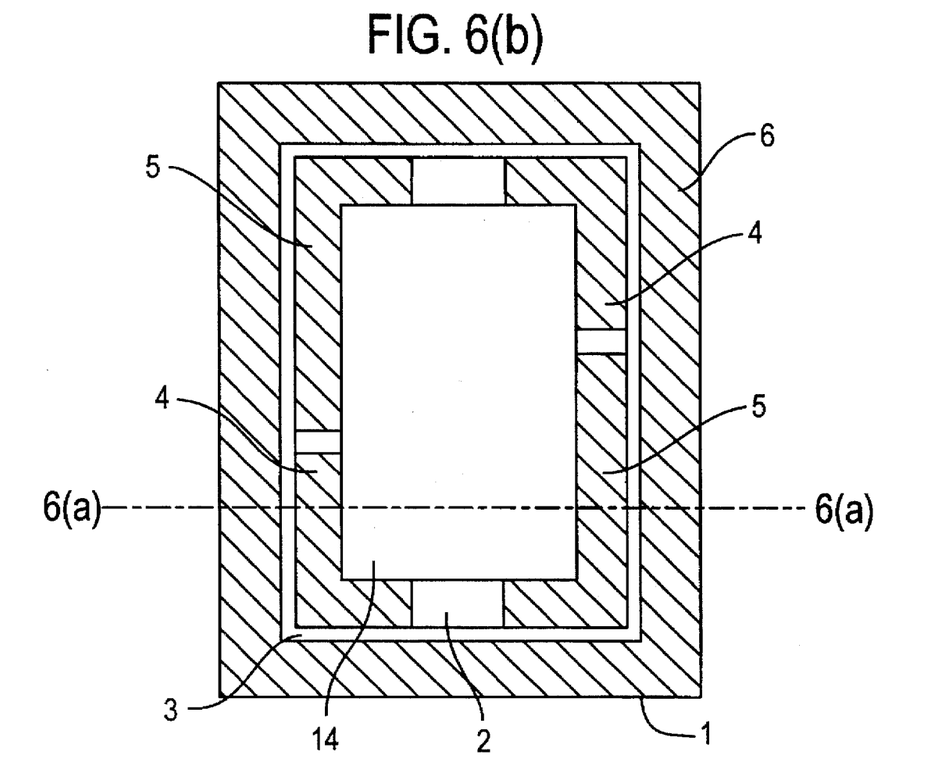
FIG. 6(b) is a top view of the device of FIG. 6(a).

FIG. 6(a) is a sectional view of a sixth embodiment of the surface acoustic wave device of the present invention, and FIG. 6(b) is a top view of the device of FIG. 6(a).

In FIG. 6(a), reference numeral 22 is a grounding electrode layer. The other elements which are identical to elements of FIG. 1(a) and (b) are identified by the same reference numerals.

According to the sixth embodiment, the multi-layer substrate 1 comprises dielectric layers 2, 3 made of low temperature baking material that can be baked at 1000° C. or less, and dielectric layer 2 comprises plural layers 2-1 and 2-2. On the principal surface side of the dielectric layer 2-1 in green sheet form having via holes 9 and 10, input and output electrodes 4 and grounding electrode 5 are formed by electrode paste. On the principal surface side of the dielectric layer 2-2 in green sheet form having via holes 9 and 10, the grounding electrode layer 22 is formed by electrode paste. Finally, on the principal surface side of the dielectric layer 3 in green sheet form having a recess, the grounding electrode 6 is formed by electrode paste. The dielectric layer 3, dielectric layer 2-1, and dielectric layer 2-2 are laminated sequentially from the top, and baked at 900° C. The outer electrode 7 and outer terminal 8 are formed by the method shown in the first embodiment. Thus, the outer electrode 7 is electrically connected with the input and output electrodes 4 through the via hole 9, with the grounding electrode 5 and grounding electrode layer 22 through the via hole 10, and with the grounding electrode 6 through the outer terminal 8. In the via hole 9, contact with the grounding electrode layer 22 is avoided in the area intersecting with the grounding electrode layer 22. By mounting the surface acoustic wave element 14 on such multi-layer substrate 1 by the method shown in the first embodiment, an ultra-small surface acoustic wave device as in the first embodiment is obtained.

In the surface acoustic wave device of the sixth embodiment because the grounding electrode layer 22 is provided in the multi-layer substrate 1, external electromagnetic effects are negated (i.e., shut-off), and favorable frequency characteristics are obtained. The same action and effects as in the surface acoustic wave device of the first embodiment are obtained by the sixth embodiment.

In the sixth embodiment, the guard layer comprising the dielectric layer shown in the first embodiment is used. However, the guard layer comprising the metal ring shown in the second embodiment can also be used. It can also be applied in the third, fourth and fifth embodiments.

(Embodiment 7)

Figure 7A:
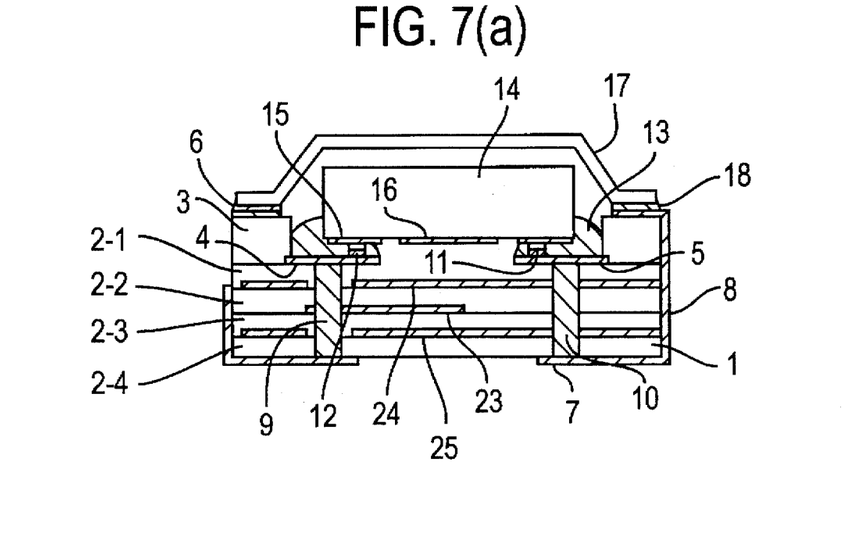
FIG. 7(a) is a sectional view of a surface acoustic wave device of a seventh embodiment of the invention.
Figure 7B:
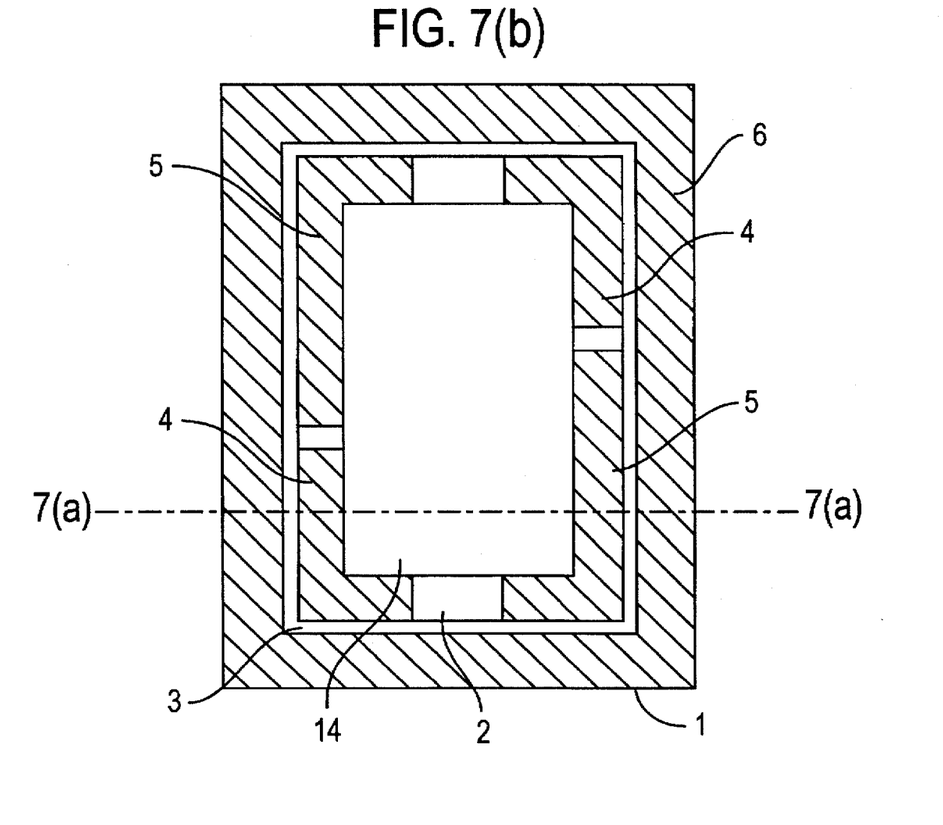
FIG. 7(b) is a top view of the device of FIG. 7(a).

FIG. 7(a) is a sectional view of a seventh embodiment of the surface acoustic wave device of the present invention, and FIG. 7(b) is a top view of the device illustrated in FIG. 7(a).

In FIG. 7(a), reference numeral 23 is a matching circuit unit and 24 and 25 are grounding electrode layers. The other elements which are identical to elements of FIG. 1(a) and (b) are identified by the same reference numerals.

According to the seventh embodiment, the multi-layer substrate 1 comprises dielectric layers 2, 3 made of low temperature baking material that can be baked at 1000° C. or less, and the dielectric layer 2 comprises plural layers 2-1, 2-2, 2-3, 2-4. On the principal surface side of the dielectric layer 2-1 in green sheet form having via holes 9 and 10, input and output electrodes 4 and grounding electrodes 5 are formed by electrode paste. On the principal surface side of the dielectric layers 2-2 and 2-4 in green sheet form having via holes 9 and 10, grounding electrode layers 24 and 25 are formed by electrode paste. On the principal surface side of the dielectric layer 2-3 in green sheet form having via holes 9 and 10, strip lines and a capacitor electrode for forming the matching circuit unit 23 are formed by electrode paste. Finally, on the principal surface side of the dielectric layer 3 in green sheet form for forming a recess, the grounding electrode 6 is formed by electrode paste. The dielectric layer 3, dielectric layer 2-1, dielectric layer 2-2, dielectric layer 2-3 and dielectric layer 2-4 are laminated sequentially from the top, and baked at 900° C. The outer electrode 7 and outer terminal 8 are formed by the method shown in the first embodiment. As such, the outer electrode 7 is electrically connected with the input and output electrodes 4 through the via hole 9, with the grounding electrode 5 and grounding electrode layers 24 and 25 through the via hole 10, and with the grounding electrode 6 through the outer terminal 8. The matching circuit unit 23 is electrically connected with the input and output electrodes 4 and outer electrode 7 through the via hole 9. In the via hole 9, contact with the grounding electrode layers 24 and 25 is avoided in the area intersecting with the grounding electrode layers 24 and 25. By mounting the surface acoustic wave element 14 on such multi-layer substrate 1, by the method shown in the first embodiment, an ultra-small surface acoustic wave device as in the first embodiment is obtained.

In the surface acoustic wave device in the seventh embodiment, two grounding electrode layers 24 and 25 are formed in different layers in the multi-layer substrate 1, and the matching circuit unit 23 is formed between them through the dielectric layer. Accordingly, if the input and output impedance of the surface acoustic wave element 14 differs from the impedance of the outer circuit, by properly selecting the dimensions of the strip lines and the capacitor electrode of the matching circuit unit 23, for example, to match the surface acoustic wave filter for the intermediate frequency band used in mobile communication devices, the input and output impedances can be matched. As such, the device of current embodiment allows for a significant reduction in size as compared with the conventional matching circuit unit formed on the circuit substrate. Moreover, external electromagnetic effects can be negated by the grounding electrode layers 24 and 25, and excellent frequency characteristics are obtained in both the surface acoustic wave element and the matching circuit unit. Also, the same action and effects as in the surface acoustic wave device of the first embodiment are obtained by the seventh embodiment.

In the seventh embodiment, the guard layer comprising the dielectric layer shown in the first embodiment is used. However, the guard layer comprising the metal ring shown in the second embodiment can also be used. It can also be applied in the third, fourth and fifth embodiments.

In the first, second, third, fourth, fifth, sixth and seventh embodiments, lithium tantalate is used as the piezoelectric substrate of the surface acoustic wave element, but lithium niobate, lithium borate, or rock crystal, or any other suitable material can be used. As the metal bump, instead of gold used herein, aluminum or any other suitable material can be used. As the electrode paste used in the strip lines and capacitor electrodes for composing the input and output electrodes, grounding electrode, outer electrode, outer terminal, grounding electrode layer, and matching circuit unit, Ag compound electrode paste is used, but Cu compound electrode paste, or any other suitable material, can also be used. The dielectric material for composing the multi-layer substrate, a low temperature baking material that can be abed at 1000° C. may be used, and for example, materials of alumina glass compound can be used.

Of course, it should be understood that a wide range of changes and modifications can be made to the preferred embodiment described above. It is therefore intended that the foregoing detailed description be regarded as illustrative rather than limiting and that it be understood that it is the following claims, including all equivalents, which are intended to define the scope of the invention.

What is claimed:

1. A surface acoustic wave device comprising:
   a dielectric substrate comprising an input electrode and an output electrode and a grounding electrode on a first surface of said dielectric substrate, and an outer electrode on a second surface of said dielectric substrate,
   a surface acoustic wave element comprising an electrode pad and a comb-shaped electrode disposed on a first surface of said surface acoustic wave element, said surface acoustic wave element bonded to said dielectric substrate by face-down method via a metal bump and a conductive resin formed on said electrode pad,
   an insulating resin deposited on the periphery of said metal bump, and
   a guard layer longer in height than the metal bump and shorter in height than the surface acoustic wave element, said guard layer being formed adjacent the surface acoustic wave element on said first surface of said dielectric substrate.

2. A surface acoustic wave device of claim 1, wherein said surface acoustic wave element comprises a piezoelectric substrate selected from the group consisting of lithium tantalate, lithium niobate, lithium borate, and rock crystal.

3. A surface acoustic wave device of claim 1, wherein the metal bump comprises gold or aluminum.

4. A surface acoustic wave device of claim 1, wherein the guard layer comprises the same dielectric material as the dielectric substrate.

5. A surface acoustic wave device of claim 1, wherein the material of the dielectric substrate is a low temperature baking material that can be baked at 1000° C. or less, and the conductors for forming the input and output electrodes, grounding electrode, and outer electrode comprise a silver compound or copper compound.

6. A surface acoustic wave device of claim 1, wherein the guard layer comprises a metal ring, and the guard layer is electrically connected with the grounding electrode, and not electrically connected with the input and output electrodes.

7. A surface acoustic wave device of claim 1, wherein metal bumps are disposed on opposing sides of the first surface of the surface acoustic wave element.

8. A surface acoustic wave device of claim 7, wherein the metal bumps disposed on opposing sides of the first surface of the surface acoustic wave element are disposed alternately so as to form two rows on each opposing side.

9. A surface acoustic wave device of claim 1, wherein a second guard layer is formed on the first surface of the surface acoustic wave element so as to be positioned between the metal bump and comb-shaped electrode.

10. A surface acoustic wave device of claim 9, wherein the second guard layer formed on the first surface of the surface acoustic wave element comprises a sound absorbing material.

11. A surface acoustic wave device of claim 1, wherein the dielectric substrate is a multi-layer substrate having at least one grounding electrode layer interposed in the multi-layer substrate, and the grounding electrode formed on the first surface of the multi-layer substrate is electrically connected with said grounding electrode layer.

12. A surface acoustic wave device of claim 1, wherein the dielectric substrate is a multi-layer substrate comprising a laminate structure of at least four layers, grounding electrode layers are formed on a principal surface side of the second layer and fourth layer from a top layer, a matching circuit unit comprising strip lines and capacitor electrode is formed on a principal surface side of the third layer from the top layer, said matching circuit unit is electrically connected with the input and output electrodes formed on a principal surface of the first layer.

13. A surface acoustic wave device comprising:
   a dielectric substrate comprising an input electrode and an output electrode and a grounding electrode on a first surface of said dielectric substrate, and an outer electrode on a second surface of said dielectric substrate;
   a surface acoustic wave element comprising an electrode pad and a comb-shaped electrode disposed on a first surface of said surface acoustic wave element, said surface acoustic wave element bonded to said dielectric substrate by face-down method via a metal bump and a conductive resin formed on said electrode pad;

an insulating resin deposited on the periphery of said metal bump; and a guard layer shorter in height than the surface acoustic wave element, said guard layer being formed adjacent the surface acoustic wave element on said first surface of said dielectric substrate, wherein the guard layer comprises the same dielectric material as the dielectric substrate.

14. A surface acoustic wave device comprising:

a dielectric substrate comprising an input electrode and an output electrode and a grounding electrode on a first surface os said dielectric substrate, and an outer electrode on a second surface of said dielectric substrate, a surface acoustic wave element comprising an electrode pad and a comb-shaped electrode disposed on a first surface of said surface acoustic wave element, said surface acoustic wave element bonded to said dielectric substrate by face-down method via a metal bump and a conductive resin formed on said electrode pad, an insulating resin deposited on the periphery of said metal bump, and a guard layer shorter in height than the surface acoustic wave element, said guard layer being formed adjacent the surface acoustic wave element on said first surface of said dielectric substrate, wherein a second guard layer is formed on the first surface of the surface acoustic wave element so as to be positioned between the metal bump and comb-shaped electrode.

15. The surface acoustic wave device of claim 14, wherein the second guard layer formed on the first surface of the surface acoustic wave element comprises a sound absorbing material.

* * * * *

UNITED STATES PATENT AND TRADEMARK OFFICE
CERTIFICATE OF CORRECTION

PATENT NO. : 5,699,027
DATED : December 16, 1997
INVENTOR(S) : Yasunobu TSUJI et al.

It is certified that error appears in the above-indentified patent and that said Letters Patent is hereby corrected as shown below:

<u>Col. 11</u>, line 12, delete "os" and insert --of--.

Signed and Sealed this

Twenty-eighth Day of April, 1998

Attest:

BRUCE LEHMAN

Attesting Officer

Commissioner of Patents and Trademarks